United States Patent
Peng et al.

(10) Patent No.: US 8,944,080 B2
(45) Date of Patent: Feb. 3, 2015

(54) CLEANING SYSTEM, CLEANING DEVICE, AND METHOD OF USING CLEANING DEVICE

(75) Inventors: Yen-Shao Peng, Miaoli (TW);
Chia-Hao Hsueh, Hsinchu (TW);
Kuo-Hsing Teng, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 586 days.

(21) Appl. No.: 13/196,086

(22) Filed: Aug. 2, 2011

(65) Prior Publication Data

US 2013/0032173 A1 Feb. 7, 2013

(51) Int. Cl.
*B08B 9/027* (2006.01)
*H01L 21/67* (2006.01)

(52) U.S. Cl.
CPC .......... *H01L 21/67017* (2013.01); *B08B 9/027* (2013.01); *H01L 21/67051* (2013.01)
USPC .................. 134/104.1; 134/166 R; 134/166 C (58) Field of Classification Search
CPC ............ B08B 9/00; B08B 9/02; B08B 9/027; B08B 9/032; B08B 9/00321
See application file for complete search history.

(56) References Cited

U.S. PATENT DOCUMENTS

| 6,238,735 | B1 | 5/2001 | Mandal et al. |
| 2008/0017220 | A1* | 1/2008 | Kodera et al. ..................... 134/2 |
| 2011/0030737 | A1* | 2/2011 | Amano et al. ................... 134/32 |
| 2011/0297082 | A1* | 12/2011 | Watanabe et al. ............. 118/663 |

FOREIGN PATENT DOCUMENTS

| CN | 1818795 A | 8/2006 |
| CN | 101996914 A | 3/2011 |
| JP | 3168606 B2 | 5/2001 |
| TW | 561516 B | 11/2003 |
| TW | 22313-1450 A | 5/2009 |
| TW | 200919569 A | 5/2009 |

* cited by examiner

*Primary Examiner* — Michael Kornakov
*Assistant Examiner* — Ryan Coleman
(74) *Attorney, Agent, or Firm* — Muncy, Geissler, Olds & Lowe, P.C.

(57) ABSTRACT

A cleaning device is provided, including a top portion, a middle portion, and a bottom portion. The top portion includes a first opening. The middle portion is connected to the top portion, and includes an inlet on a lateral side, an annular channel communicated with the inlet, and a second opening communicated with the first opening. The bottom portion is connected to the middle portion, and includes a reservoir and a third opening. The third opening communicates the second opening and the reservoir.

9 Claims, 7 Drawing Sheets

CLEANING SYSTEM, CLEANING DEVICE, AND METHOD OF USING CLEANING DEVICE

BACKGROUND OF THE INVENTION

1. Field of the Invention

This application relates in general to a cleaning device and in particular to a cleaning device for a processing equipment which uses a processing liquid.

2. Description of the Related Art

Figure 1:
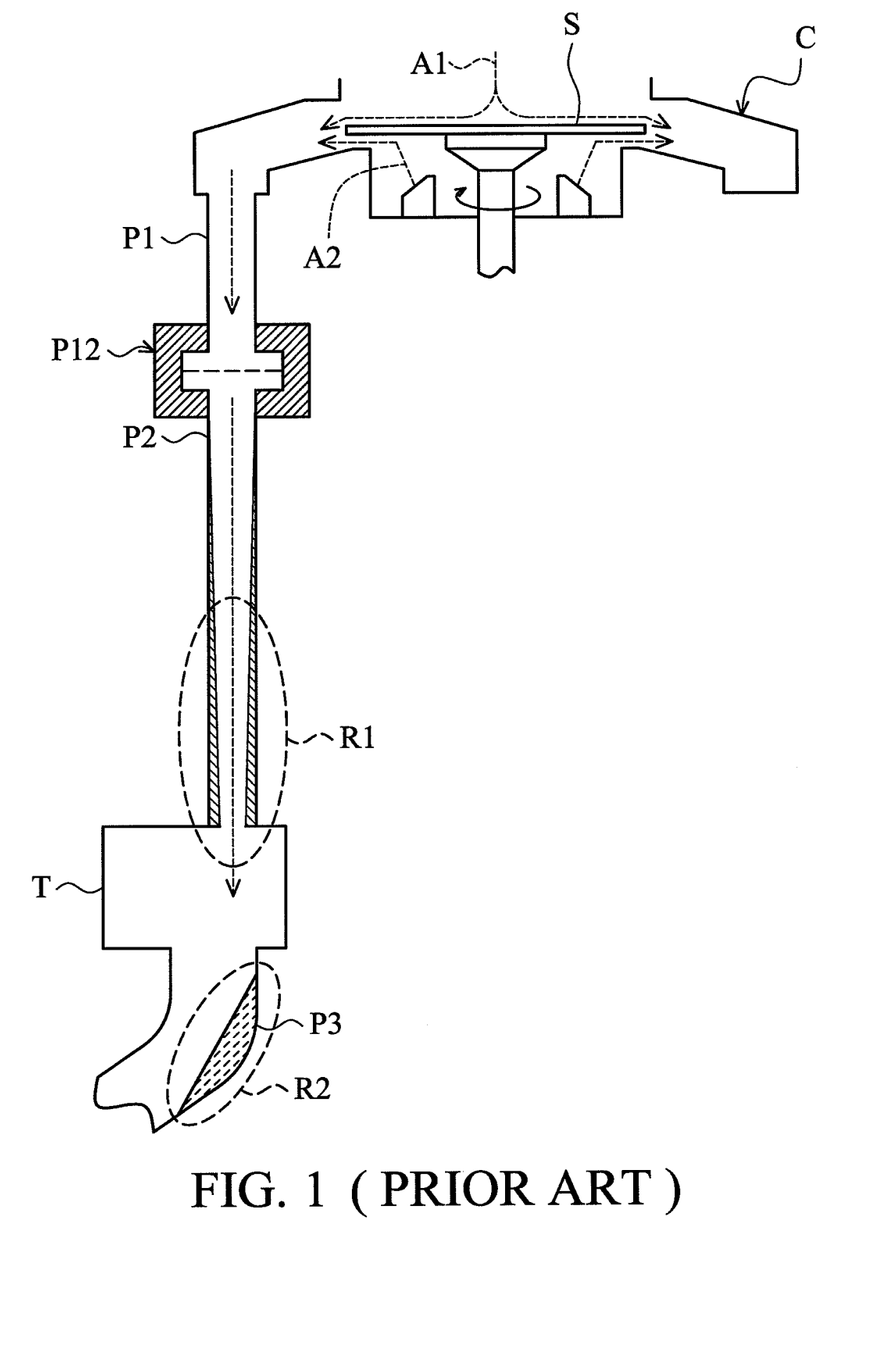
FIG. 1 is a perspective diagram of a conventional piping clamp connecting an exhaust pipe of a processing equipment, such as a spin coater, with a drain pipe.

A processing equipment, such as a spin coater, usually includes a plurality of pipes to guide a liquid for processing. For example, referring to FIG. 1, a conventional spin coater C includes an exhaust pipe P1 communicated with a drain pipe P2. In a semiconductor manufacturing process, such as a photolithography process, a substrate S is disposed on a chuck of the spin coater C. When the substrate S spins, the processing liquid including photo resister and the cleaning liquid (such as a photo resister thinner or a dilution agent) are flung out of the substrate S and discharged through the exhaust pipe P1, as the arrows A1 and A2 indicate in FIG. 1.

Generally, the drain pipe P2 is connected to the exhaust pipe P1 of the spin coater C via a piping clamp P12. Owing to the long distance of the drain pipe P2, progressive crystallization and deposition of the photo resister may occur and clog the drain pipe P2, as the region R1 shows in FIG. 1. The residue liquid in the drain pipe P2 subsequently flows to a drain tank T, and is discharged through a curved pipe P3 to a facility piping system. However, crystallization and deposition of the photo resister may also lead to clogging in the curved portion P3, as the region R2 shows in FIG. 1.

It is therefore an object of the invention to provide a cleaning device, for the processing equipment, that improves the clogging in the pipes of the processing equipment.

BRIEF SUMMARY OF INVENTION

An objective of the application is to provide a cleaning device, including a top portion, a middle portion, and a bottom portion. The top portion includes a first opening. The middle portion is connected to the top portion, and includes an inlet on a lateral side, an annular channel communicated with the inlet, and a second opening communicated with the first opening. The bottom portion is connected to the middle portion, and includes a reservoir and a third opening. The third opening communicates the second opening and the reservoir.

In an exemplary embodiment, the middle portion further includes a plurality of passageways communicated with the annular channel. The passageways are spaced apart from each other. A width of the annular channel exceeds a diameter of each of the passageways. The reservoir has a base and an annular dam disposed on the base, and the annular dam leaves a hollow communicated with the third opening. The annular dam is constructed with an inclined surface around the hollow. The top portion, the middle portion, and the bottom portion are connected by welding or adhesive bonding.

The invention further provides a cleaning system including a top portion, a middle portion, a bottom portion, a solvent tank, a valve, and a controller. The top portion includes a first opening. The middle portion is connected to the top portion, and includes an inlet on a lateral side, an annular channel communicated with the inlet, and a second opening communicated with the first opening. The bottom portion is connected to the middle portion, and includes a reservoir and a third opening. The third opening communicates the second opening and the reservoir. The valve is connected to the solvent tank and the inlet of the middle portion. The controller is connected to the valve.

Furthermore, the cleaning system includes a flow meter connected to the solvent tank.

The invention further provides a method of using a cleaning device, including the following steps. The cleaning device is assembled to a processing equipment. A first signal is sent from the processing equipment to a controller when a processing liquid in the processing equipment starts to dispense. A second signal is sent from the controller to open a valve. A solvent is conducted from a solvent tank through the valve to the cleaning device.

In an exemplary embodiment, the method further includes the following steps. When the processing liquid starts to dispense, a drain pipe connected to the cleaning device is pre-wetted by the solvent. The solvent is guided through the plurality of passageways to the reservoir. When an amount of the solvent exceeds a capacity of the reservoir, the excess solvent is guided through the inclined surface to the drain pipe. The drain pipe may be cleaned by the solvent intermittently. The cleaning device and an exhaust pipe of the processing equipment may be wetted by vaporization of the solvent. The solvent includes a photo resister thinner or a dilution agent. The flow meter is provided for monitoring a flow rate of the solvent, and is adjusted to control the flow rate of the solvent.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 2:
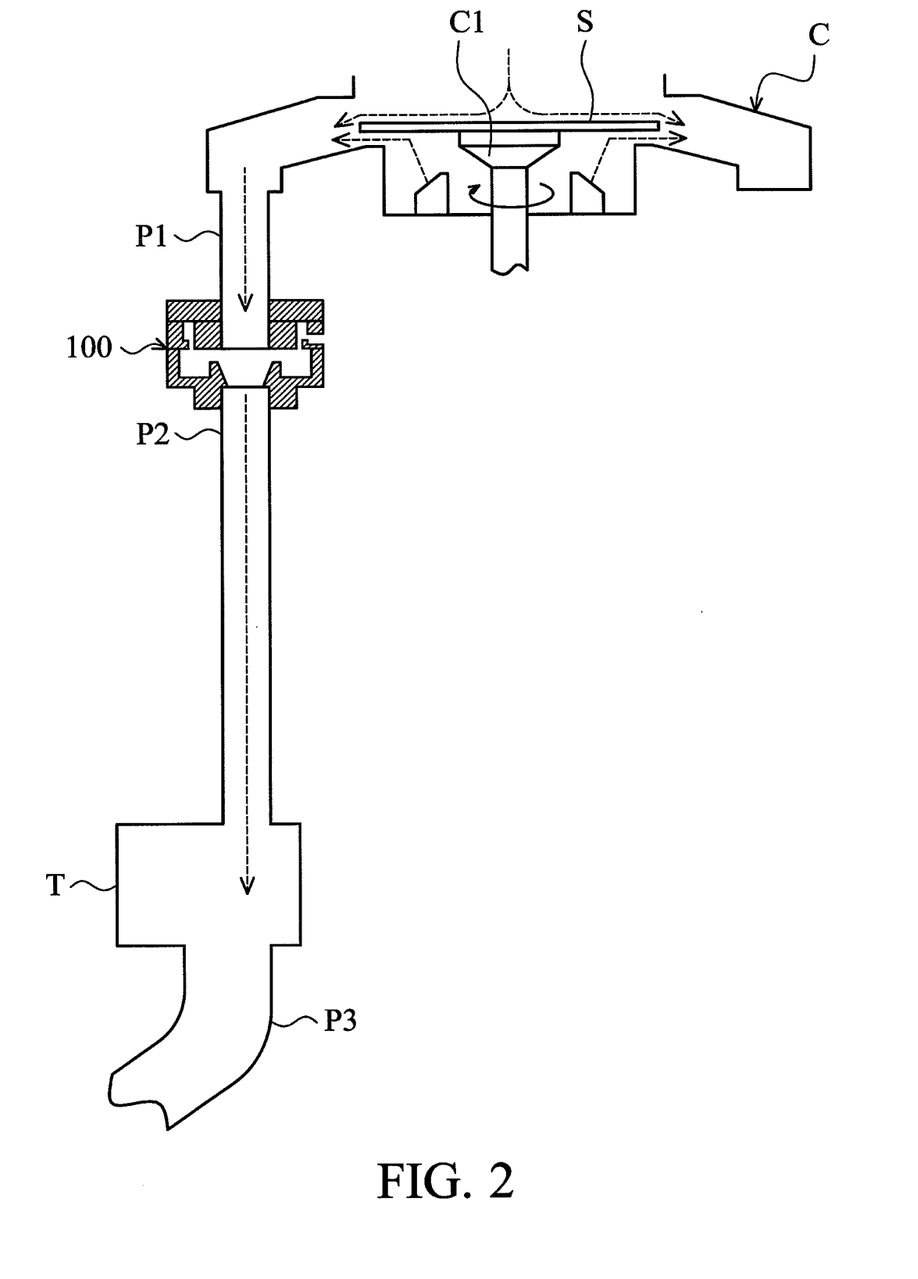
FIG. 2 is a perspective diagram of a cleaning device connected an exhaust pipe of a spin coater with a drain pipe according to an embodiment of the invention.

Referring to FIG. 2, an embodiment of a cleaning device 100 connects an exhaust pipe P1 of a spin coater C with a drain pipe P2. Note that the cleaning device 100 can be located at a position the same as the position of the piping clamp P12 shown in FIG. 1; however, it is not limited to this. In a semiconductor manufacturing process, such as a photolithography process, a substrate S is disposed on a chuck C1 of the spin coater C. When the substrate S spins, the photo resister and the cleaning liquid (such as a photo resister thinner or a dilution agent) are flung out of the substrate S and discharged to the exhaust pipe P1. In this embodiment, the discharged liquid flows through the cleaning device 100 and the drain pipe P2 to a drain tank T. The discharged liquid sequentially passes through a curved pipe P3 to a facility piping system (not shown).

Figure 3:
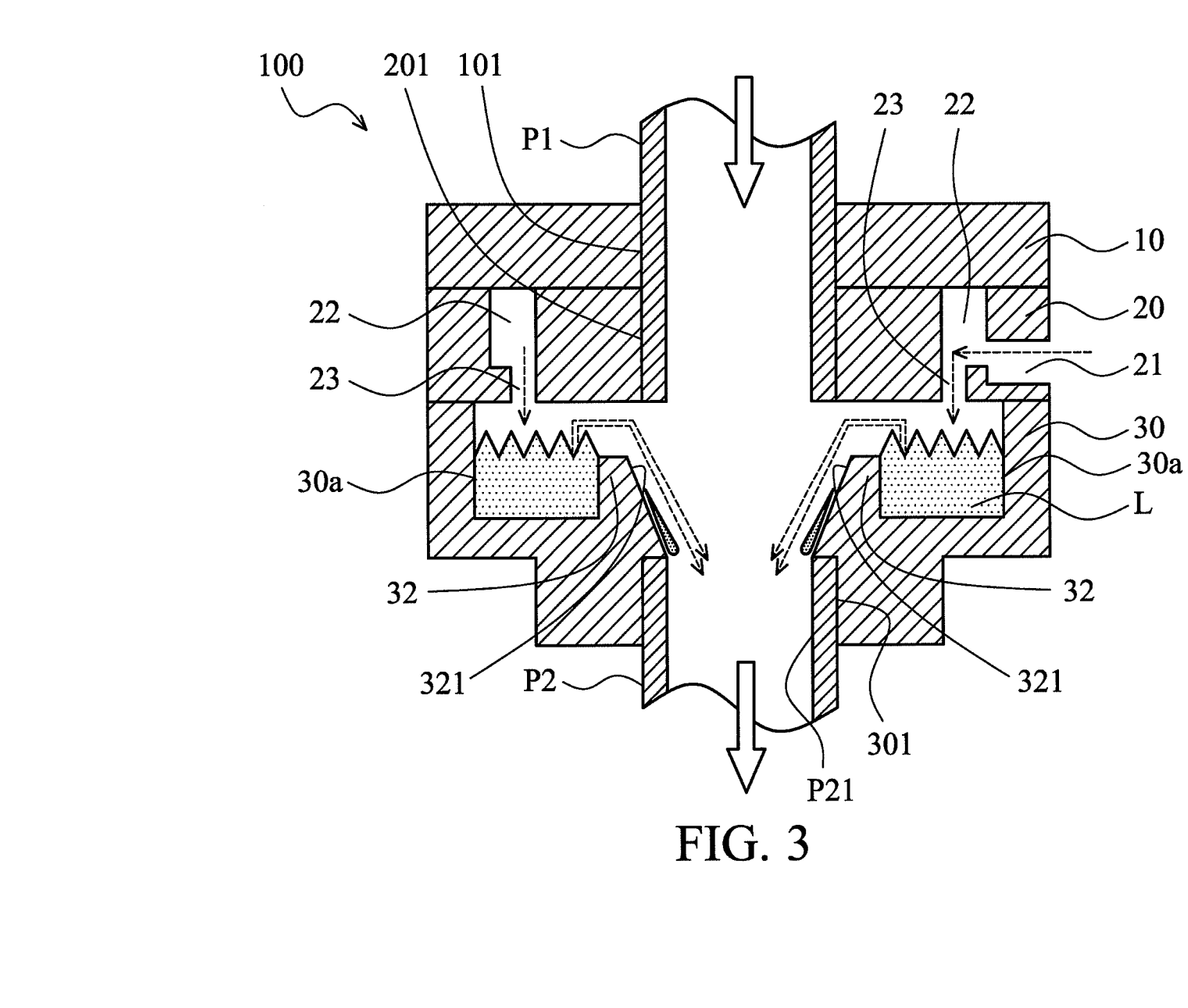
FIG. 3 is a sectional view of a cleaning device according to an embodiment of the invention.
Figure 4:
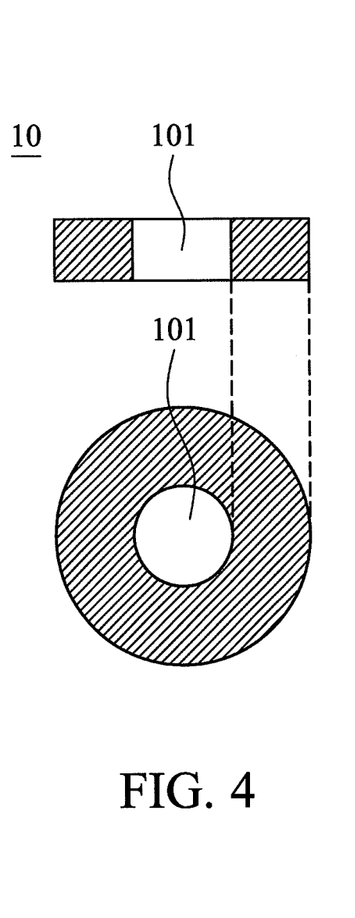
FIG. 4 shows a sectional view and a top view of a top portion of the cleaning device in FIG. 3.

Referring to FIGS. 3-6, the cleaning device 100 primarily includes a top portion 10, a bottom portion 30, and a middle portion 20 connected between the top portion 10 and the bottom portion 30. In some embodiments, the top portion 10, the middle portion 20, and the bottom portion 30 may be assembled by welding or adhesive bonding. However, the cleaning device 100 may also be integrally formed in one piece. As shown in FIGS. 3 and 4, the top portion 10 of the cleaning device 100 has a cylinder structure and forms a first opening 101. The first opening 101 may connect any prearranged exhaust pipe P1 that is designed or installed to afford an exhaust service.

Figure 5:
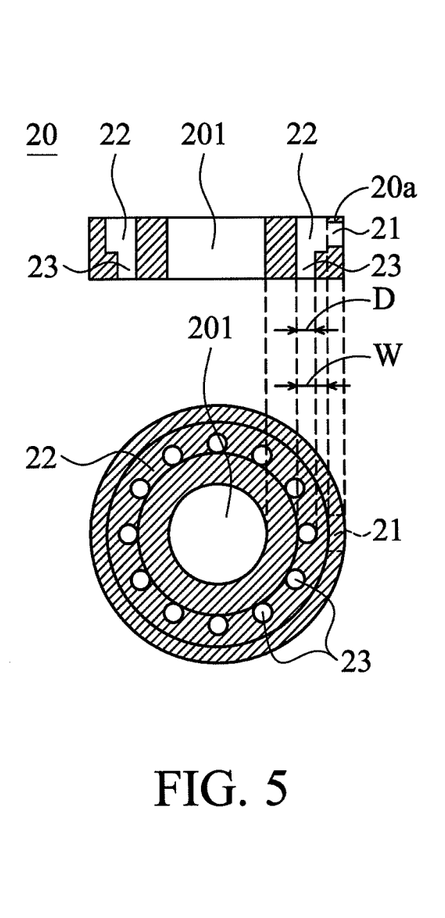
FIG. 5 shows a sectional view and a top view of a middle portion of the cleaning device in FIG. 3.

The middle portion 20 of the cleaning device 100 is connected to the top portion 10 and includes a second opening 201 communicated with the first opening 101, as shown in FIGS. 3 and 5. Note that the exhaust pipe P1 is disposed in the first opening 101 and the second opening 201. Furthermore, the middle portion 20 includes an inlet 21 formed on a lateral side 20a. A solvent L such as the photo resister thinner or the dilution agent can be induced into the cleaning device 100 via the inlet 21. In this embodiment, the middle portion 20 further includes a plurality of passageways 23 and an annular channel 22 communicated with the passageways 23. The annular channel 22 has a width W. The passageways 23 are spaced apart from each other. Each passageway 23 has a diameter D. The width W of the annular channel 22 exceeds the diameter D of each of the passageways 23. The solvent L is sequentially induced through the inlet 21, the annular channel 22, and the passageways 23 to the bottom portion 30. The passageways 23 can reduce the flow speed and evenly distribute the solvent L to the bottom portion 30.

Figure 6:
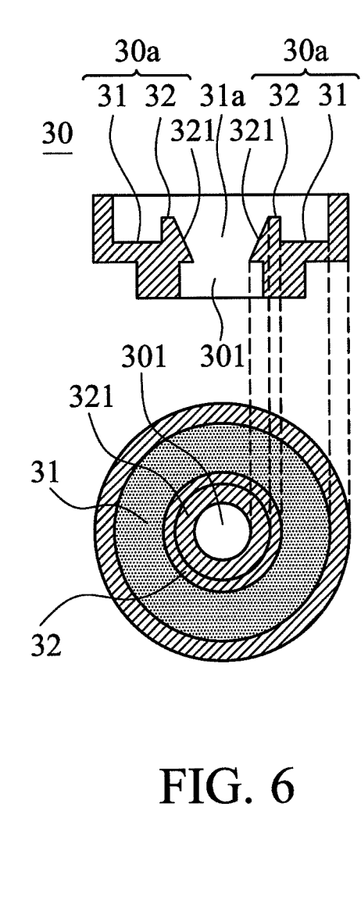
FIG. 6 shows a sectional view and a top view of a bottom portion of the cleaning device in FIG. 3.

As shown in FIGS. 3 and 6, the bottom portion 30 of the cleaning device 100 is connected to the middle portion 20 and forms a third opening 301 communicated with the second opening 201. In this embodiment, the drain pipe P2 is disposed in the third opening 301 of the bottom portion 30. Thus, the exhaust pipe P1 and the drain pipe P2 can communicate with each other via the first, second and third openings 101, 201, and 301 of the cleaning device 100.

Specifically, the bottom portion 30 forms a reservoir 30a which functions for preserving a supply of the solvent L. The reservoir 30a may have a round base 31 and an annular dam 32 disposed on the round base 31. Specifically, the annular dam 32 is located in the center of the round base 31 that leaves a hollow 31a in the middle of the reservoir 30a. The annular dam 32 may be constructed with an inclined surface 321 around the hollow 31a. The hollow 31a is communicated with the third opening 301. The amount of the solvent L may exceed the capacity of the reservoir 30a. If so, the excess solvent L will be guided by the inclined surface 321 smoothly while passing through the hollow 31a. Subsequently the excess solvent L enters the third opening 301 that may connect any prearranged drain pipe P2 that is designed or installed to afford an exhaust service.

As shown in FIG. 3, the solvent L is induced through the inlet 21, the annular channel 22, and the passageways 23 of the middle portion 20 to the reservoir 30a. When the amount of the solvent L exceeds the capacity of the reservoir 30a, the excess solvent L spills over the annular dam 32, the inclined surface 321 of the annular dam 32 can guide the solvent L to smoothly flow to the drain pipe P2. Thus, the inner surface P21 of the drain pipe P2 can be pre-wetted to prevent crystallization and deposition of the photo resister thereon.

Figure 7:
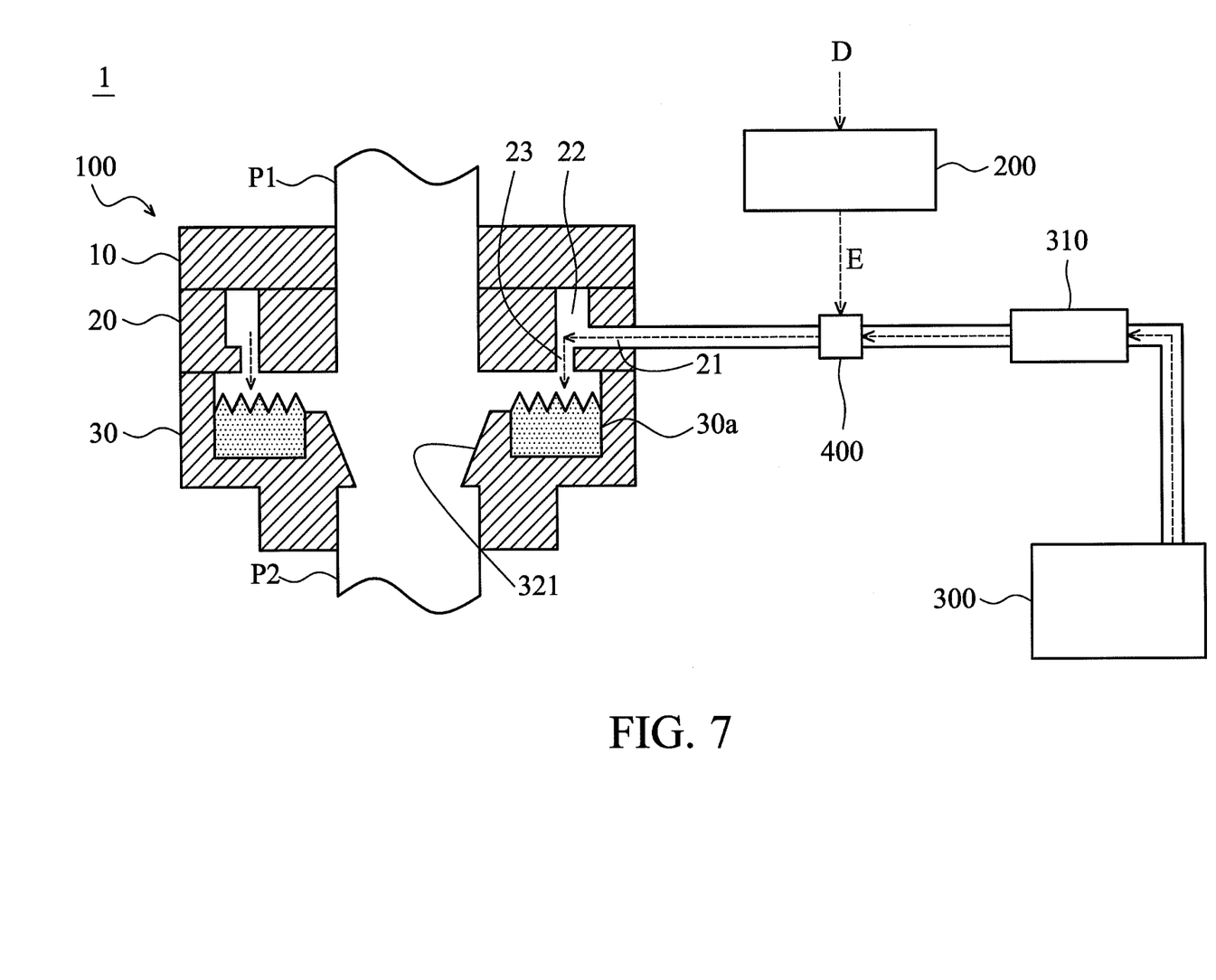
FIG. 7 is a perspective diagram of a cleaning device incorporated into a cleaning system according to an embodiment of the invention.

Referring to FIG. 7, an embodiment of the cleaning device 100 may be incorporated into a cleaning system 1. The cleaning system 1 may further include a controller 200, a solvent tank 300, a flow meter 310, and a valve 400. In this embodiment, the spin coater C may send a first signal D to the controller 200 when a processing liquid (such as photo resister) is dispensed onto the substrate S in the spin coater C, and the controller 200 may send a second signal E to the valve 400 to open the valve 400 when receiving the first signal D from the spin coater C. Thus, the solvent L can be conducted from the solvent tank 300 through the flow meter 310 and the valve 400 to the cleaning device 100. Specifically, in the cleaning device 100, the solvent L is guided through the plurality of passageways 23 to the reservoir 30a. When the amount of the solvent L exceeds the capacity of the reservoir 30a, the excess solvent L is guided through an inclined surface 321 to the drain pipe P2 connected to the cleaning device 100. As a result, the drain pipe P2 can be pre-wetted by the solvent L when the processing liquid starts to dispense. Additionally, the flow meter 310 monitor a flow rate of the solvent L, and is adjustable to control the flow rate of the solvent L.

Figure 8:
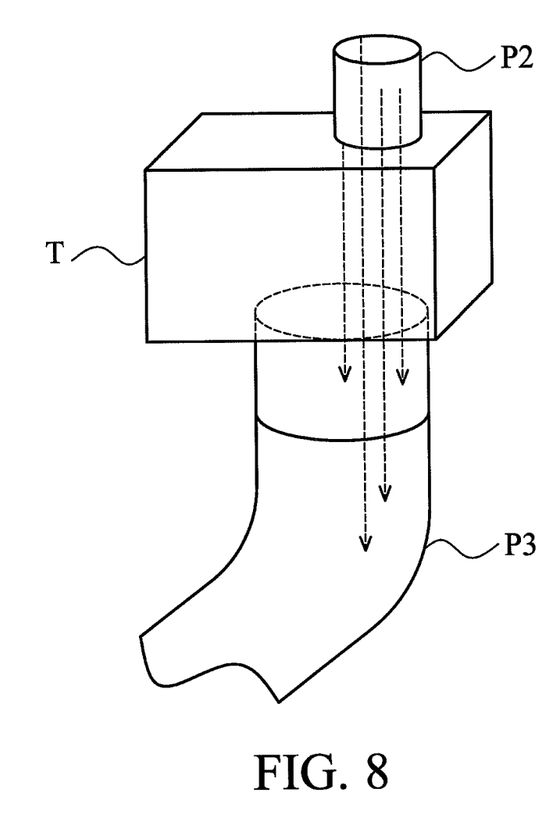
FIG. 8 is a perspective diagram of a solvent flowing downstream to wash a drain pipe and a curved pipe according to an embodiment of the invention.

During the process, the valve 400 can be intermittently opened for a predetermined time period. When the valve 400 is opened for a long period of time, the solvent L can directly flow downstream to wash and clean the drain pipe P2 and the curved pipe P3, as the arrows indicate in FIG. 8. Thus, the drain pipe P2 and the curved pipe P3 are prevented from crystallization or deposition of the photo resister.

Figure 9:
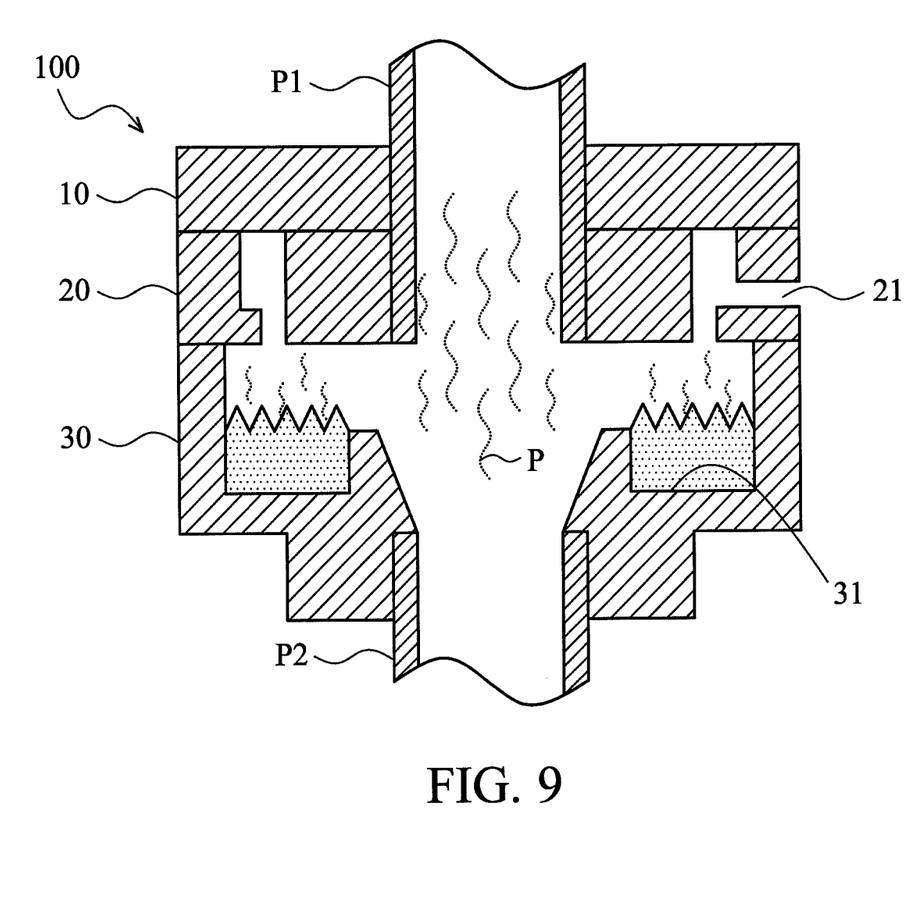
FIG. 9 is a perspective diagram of a solvent generating a solvent vapor in a cleaning device according to an embodiment of the invention.

When the process is completed, the controller 200 sends a close signal to the valve 400. With the valve 400 closed, no more solvent L is induced into the cleaning device 100. In this circumstance, the solvent L in the reservoir 30a can still be vaporized to generate a solvent vapor P to the exhaust pipe P1 and the drain pipe P2 near the cleaning device 100, as shown in FIG. 9. Since the solvent vapor P can suppress crystallization and deposition of the photo resister, clogging of the drain pipe P2 is prevented to facilitate smooth flow of the discharged fluid.

In this embodiment, the cleaning device 100 is assembled to the spin coater C; however, it is not limited to his. The cleaning device 100 may also be applied to different processing equipments which use a processing liquid. When the processing liquid is dispensed onto a substrate in the processing equipment, the controller 200 may receive the first signal D from the processing equipment and send the second signal E to the valve 400, such that the valve 400 is opened, and the solvent L can flow from the solvent tank 300 through the valve 400 to the cleaning device 100.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A cleaning device for removing deposits from a drain pipe, the cleaning device comprising:
   a top portion, comprising a first opening through which fluid from a first drain pipe can flow;
   a middle portion connected to the top portion, comprising an inlet on a lateral side, an annular channel in fluid communication with the inlet, and a second opening communicated with the first opening, wherein the inlet on the lateral side is configured to deliver cleaning liquid to the annular channel; and a bottom portion connected to the middle portion, comprising a third opening and a reservoir having a base and an annular dam disposed on the base, wherein cleaning liquid is delivered to the reservoir from the annular channel, and wherein the annular dam is configured such that cleaning liquid can overflow from the dam and travel through the third opening and enter a second drain pipe that is in fluid communication with the second opening and the reservoir.

2. The cleaning device as claimed in claim 1, wherein the middle portion further comprises a plurality of passageways communicated with the annular channel.

3. The cleaning device as claimed in claim 2, wherein a width of the annular channel exceeds a diameter of each of the passageways.

4. The cleaning device as claimed in claim 2, wherein the passageways are spaced apart from each other.

5. The cleaning device as claimed in claim 1, wherein the annular dam leaves a hollow communicated with the third opening.

6. The cleaning device as claimed in claim 5, wherein the annular dam is constructed with an inclined surface around the hollow.

7. The cleaning device as claimed in claim 1, wherein the top portion, the middle portion, and the bottom portion are connected by welding or adhesive bonding.

8. A cleaning system for removing deposits from a drain pipe, the cleaning device comprising:

a top portion, comprising a first opening through which fluid from a first drain pipe can flow;

a middle portion connected to the top portion, comprising an inlet on a lateral side, an annular channel communicated with the inlet, and a second opening communicated with the first opening, wherein the inlet on the lateral side is configured to deliver cleaning liquid to the annular channel;

a bottom portion connected to the middle portion, comprising a third opening and a reservoir having a base and an annular dam disposed on the base, wherein cleaning liquid is delivered to the reservoir from the annular channel, and wherein the annular dam is configured such that cleaning liquid can overflow from the dam and travel through the third opening and enter a second drain pipe that is in fluid communication with the second opening and the reservoir;

a solvent tank;

a valve, connected to the solvent tank and the inlet of the middle portion; and a controller, connected to the valve.

9. The cleaning system as claimed in claim 8, further comprising a flow meter connected to the solvent tank.

* * * * *